United States Patent [19]
Yamamoto et al.

[11] Patent Number: 5,201,268
[45] Date of Patent: Apr. 13, 1993

[54] INTAGLIO PRINTING PROCESS AND ITS APPLICATION

[75] Inventors: Osamu Yamamoto; Akira Isomi, both of Hirakata; Masahide Tsukamoto, Nara, all of Japan

[73] Assignee: Matsushita Electric Industrial Co., Ltd., Osaka, Japan

[21] Appl. No.: 811,032

[22] Filed: Dec. 20, 1991

[30] Foreign Application Priority Data

Dec. 25, 1990 [JP] Japan .................................. 2-405747
Jan. 24, 1991 [JP] Japan ...................................... 3-6999

[51] Int. Cl.⁵ ........................ B41M 1/10; H05K 3/12
[52] U.S. Cl. ................................................. 101/170
[58] Field of Search ............... 101/150, 170, 152, 153, 101/401.1, 487, 488, 34, 32, 41; 156/244.16, 277, 901; 118/46, 212

[56] References Cited
U.S. PATENT DOCUMENTS
4,896,598 1/1990 Leech .................................. 101/170

*Primary Examiner*—J. Reed Fisher
*Attorney, Agent, or Firm*—Wenderoth, Lind & Ponack

[57] ABSTRACT

Disclosed is an intaglio printing process which comprises (a) forming an intaglio printing plate having groove patterns, (b) filling said groove patterns with an ink, (c) after drying said ink, forming a curable resin layer on the whole surface of the intaglio printing plate, (d) placing a body to be printed thereon without curing said resin layer, (e) curing the curable resin, and (f) stripping the body from the intaglio printing plate to form the ink patterns corresponding to the groove patterns of the intaglio on the body. There are also disclosed processes for producing a color filter, a black matrix and a circuit board.

10 Claims, 2 Drawing Sheets

INTAGLIO PRINTING PROCESS AND ITS APPLICATION

FIELD OF THE INVENTION

The present invention relates to an intaglio printing process which enables the formation of fine patterns such as color filters (including black matrix) of a liquid crystal display as well as conductive line parts of a circuit board, and its application.

BACKGROUND OF THE INVENTION

Recently, in the electronics field, miniaturization and cost reduction have strongly been required mainly in semiconductors and circuit boards. In such a field, a photolithography technique using a photoresist has hitherto been employed. In this technique, there may be used a process which comprises applying a photoresist on a material to be patterned, exposing it to light through a photomask having a pattern, etching the material to be patterned with an etching solution and then removing the photoresist. In the case of photolithography, there is an advantage that a fine pattern of less than 1 μm can be formed and dimensional accuracy is also superior. On the contrary, there are disadvantages that the equipment is expensive and it costs too much for patterning.

On the other hand, a printing technique capable of patterning at low cost has also been established. As the printing technique, for example, there are mainly four techniques such as rotary intaglio printing, planographic printing, letterpress printing and screen printing. In any printing technique, the minimum width of the pattern is limited to about 50 to 100 μm on mass-production and, at the same time, there is also a problem in dimensional accuracy.

As described above, the pattern size of several μm to about 100 μm and high dimensional accuracy are required for a liquid crystal display, and the pattern size of several tens μm to about 100 μm and large film thickness are also required especially for the circuit board.

OBJECT OF THE INVENTION

That is, main object of the present invention is to provide an intaglio printing technique wherein a fine pattern of about several μm can be prepared at low cost and the film thickness of the pattern can also be controlled, and its application.

This object as well as other objects and advantages of the present invention will become apparent to those skilled in the art from the following description with reference to the accompanying drawings.

SUMMARY OF THE INVENTION

According to the present invention, there is provided an intaglio printing process which comprises;

(a) forming an intaglio printing plate having groove patterns, (b) filling said groove patterns with an ink, (c) after drying said ink, forming a curable resin layer on the whole surface of the intaglio printing plate, (d) placing a body to be printed thereon without curing said resin layer, (e) curing the curable resin, and (f) stripping the body from the intaglio printing plate to form the ink patterns corresponding to the groove patterns of the intaglio on the body.

According to the above construction of the present invention, the adhesion between the ink and curable resin is high and the release property between the ink and intaglio groove part is superior and, therefore, the ink is completely removed from the bottom of the intaglio groove part. Thereby, transfer property is superior and the intaglio pattern shape itself can be reproduced. Therefore, the formation of fine pattern as well as printing of thick film become possible.

According to the present invention, by drying the ink with heating or UV irradiation after filling it in the intaglio groove part, the release property of the ink from the intaglio groove part is improved and, therefore, transferring is easily conducted on the substrate side and the formation of thick film becomes possible.

According to the intaglio printing process of the present invention, it becomes possible to form the pattern having a width in the range of several μm to 100 and several tens μm as well as thick fine pattern of more than 5 μm. Further, for the application thereof, it becomes possible to form a color filter of a liquid crystal display (including black matrix) as well as fine pattern and thick film pattern for the conductive line part of a circuit board.

Further, the production process comprising a pattern forming process according to the printing technique and it takes a little manhour in comparison with the process for forming a pattern by vacuum deposition, photolithography and etching and, therefore, the production cost is extremely reduced.

DETAILED DESCRIPTION OF THE INVENTION

Figure 1:
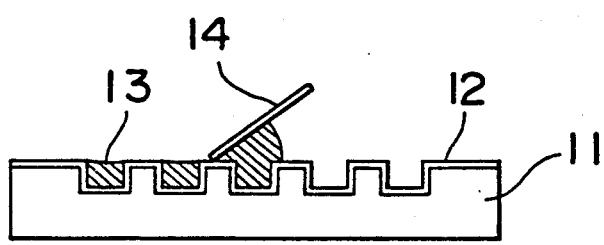
FIG. 1 is a schematic diagram illustrating an inking process of the intaglio printing in the first embodiment of the present invention.
Figure 2:
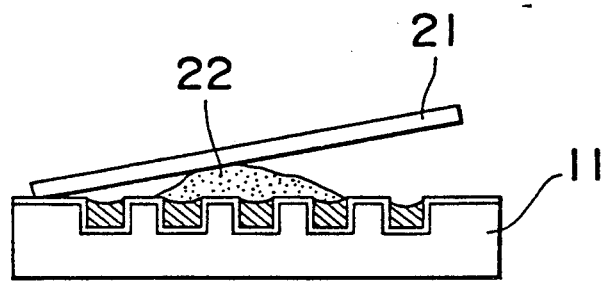
FIG. 2 is a schematic diagram illustrating a laminating process in the first embodiment of the present invention.
Figure 3:
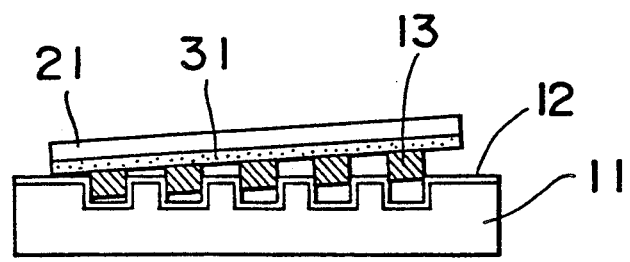
FIG. 3 is a schematic diagram illustrating a peeling process in the first embodiment of the present invention.

The first embodiment of the present invention is explained below with reference to the accompanying drawings. FIGS. 1 to 3 are schematic diagrams illustrating various processes of the intaglio printing in one embodiment of the present invention. FIG. 1 is a schematic diagram illustrating an inking process, FIG. 2 is a schematic diagram illustrating a laminating process and FIG. 3 is a schematic diagram illustrating a peeling process. In each figure, 11 is an intaglio printing plate, 12 is a release layer, 13 is an ink, 14 is a blade and 21 is a glass substrate, 22 is an UV curable resin and 31 is the cured transparent resin layer.

The method for the production of the color filter by the intaglio printing technique is described below. The intaglio printing plate 11 is prepared by forming on a silicon wafer a color filter pattern having a groove depth of 5 μ and a pattern size of 35 μm×45 μm for liquid crystal display by photolithography and dry etching technique such as ion milling. A release agent is then applied on the intaglio printing plate 11 by a dipping method, and burned to form the release layer 12. Typical examples of the release agents are 1H,1H,2H,2H-perfluorodecyl triethoxysilane, methyloctadecyldiethyoxysilane and the like.

Then, the ink 13 in which phthalocyanine organic pigment is dispersed in a vehicle of phenoxy resin is applied on the intaglio printing plate 11, and the surplus ink is removed with a ceramic blade 14 to fill a groove part with the ink (inking process, see FIG. 1).

After the ink is dried with a drier for about 10 minutes, a curable resin 22 is applied thereon and a glass substrate 21 is laminated on it while slowly slanting it from the one side thereof so as not to contain a bubble (laminating process, see FIG. 2). The curable resin 22 may be either photocurable or heat-curable.

Then, the curable resin 22 is cured by UV irradiation or heat to form a cured transparent resin layer 31. Thereafter, from the glass end, the glass substrate is peeled off by stress from the intaglio printing plate 11 to transfer an ink pattern (peeling process, see FIG. 3).

The color filter pattern formed by the printing process of the present invention has a size of 34 μm×43 μm and a film thickness of 4 μm and has a groove shape which is slightly smaller than that of the intaglio printing plate 11 as well as flat surface. In addition, the dimensional accuracy of the pattern is ±1 μm/10 cm in both longitudinal and lateral direction and is extremely excellent. Further, there is no residue of the ink in the groove part, which is different from what they used to be, and a marker having minimum line width of up to 4 μm can be printed.

When an ink which contains carbon fine particles as a main component is used, a black matrix can be made in high accuracy.

Figure 4:
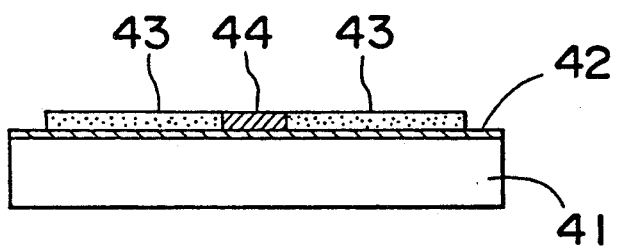
FIG. 4 is a schematic cross section illustrating a simple matrix substrate in the second embodiment of the present invention.

The second embodiment of the present invention is explained below with reference to the accompanying drawing. FIG. 4 is a schematic cross section illustrating a simple matrix liquid crystal substrate in this embodiment. In FIG. 4, 41 is a glass substrate, 42 is a SiO$_2$ layer, 43 is a transparent conductive film and 44 is a black matrix.

The method for the production of the transparent conductive film substrate with the black matrix of the simple matrix liquid crystal substrate is described below. In order to prevent the diffusion of sodium ions, a SiO$_2$ layer 42 is formed on an abraded glass substrate 42 by a sol-gel method. A transparent conductive layer of indium tin oxide (mixture of indium oxide and tin oxide) is formed thereon by a spattering method and a transparent conductive film 43 is made by photolithography and etching. Then, the same intaglio printing process as that of the first embodiment is conducted. For example, an organic copper compound ink is prepared by mixing copper mercaptide as a main material (85% by weight), organic silica (vinyl triethoxysilane), extremely small amount of organic lead and terpineol is applied on another intaglio printing plate and dried for several minutes. A curable resin is applied thereon and the glass substrate 41 having the transparent conductive layer is laminated on it while slowly slanting it from the one side thereof so as not to contain bubbles. The curable resin is cured and then the glass substrate 41 is peeled off. It is then burned at 530° C. for 25 minutes in air. As a result, the organic copper compound ink become CuO (black color) and the transfer layer disappeared to form a black matrix 44.

By using the substrate thus obtained, a liquid crystal panel is made. As a result, the film thickness of the black matrix is thin (0.2 μm) and there is no adverse effect on an orientation membrane, thereby, scope showing good contrast can be obtained in comparison with a conventional product. In addition, little crosstalk (caused by conductivity of the black matrix) between conductive films is admitted. It is considered that electrical resistance extremely increases because CuO particles are separated from each other with an insulating material such as silicone oxide.

Furthermore, oxides of metallo-organic compounds containing metals of IB, VB, VIB, VIIB, VIII group (e.g.. V, Nb, Ta, Cr, Mo, W, Mn, Fe, Ru, Co, Rh, etc.) of periodic table as a main material in addition to copper are superior in lightshielding property. As the metallo-organic compound, for example, metal carboxylate, metal alkoxide or metal mercaptide is mainly used.

Further, when oxides of organic compounds containing elements of IIIA, IVA, VA, VIA group (e.g.. B, Al, Pb,P, S, etc.) is formulated in addition to organic silica, the adhesion with the substrate is excellent. Regarding the formulation ratio, those containing the metallo-organic compound of not less than 70% by weight are required in view of lightshielding property.

Regarding the burning condition, burning in oxygen is effective, while it is necessary to severely control oxygen flow according to a kind of metallo-organic compounds.

Further, when the paste containing the above metal oxide particles as a main component is used as the ink, the black matrix having excellent lightshielding property can be made.

Figure 5:
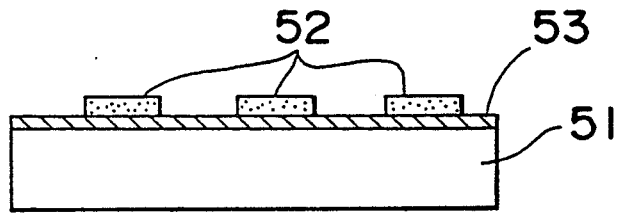
FIG. 5 is a schematic cross section illustrating a conductor pattern after transferring from the intaglio in the third embodiment of the present invention.
Figure 6:
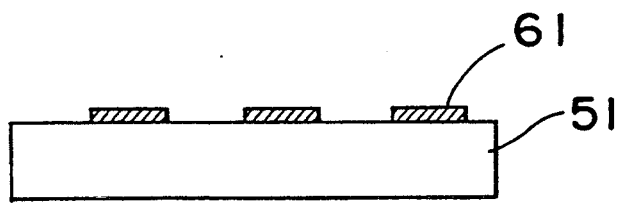
FIG. 6 is a schematic cross section illustrating a conductor pattern after burning in the third embodiment of the present invention.

The third embodiment of the present invention is explained below with reference to the accompanying drawings. FIG. 5 is a schematic cross section illustrating a conductor pattern after transferring from the intaglio printing and FIG. 6 is a schematic cross section illustrating a conductor pattern after burning. In each figure, 51 is an alumina substrate, 52 is a metall-organic compound ink, 53 is a UV curable resin layer and 61 is a gold conductor pattern.

The method for the production of the circuit board is described below. The intaglio in which a stripe pattern having the line width of 10 to 80 μm is formed by etching a silica glass substrate according to photolithography and reactive ion etching process (RIE) in an amount of about 20 μ is used.

Then, a fluorine-contained coupling agent is applied on the intaglio by a dipping process, followed by burning to form a release layer.

The gold-organic compound ink 52 (gold diisobutyl isopropyl thiolate/terpineol) is applied on the intaglio, the surplus ink is removed with a ceramic blade to fill the groove part with the ink.

After the ink is dried with a drier for about 10 minutes, the UV curable resin containing epoxy acrylate as a main material is applied thereon and an alumina substrate 51 is laminated thereon while slowly slanting it from the one side thereof so as not to contain a bubble.

Then, the UV curing photo polymer layer 53 is formed by UV irradiation from the slica intaglio side. Thereafter, from the end thereof, the alumina substrate is peeled off by stress from the intaglio to form a conductor ink pattern.

The film thickness of the pattern thus obtained by the printing technique of the present invention is 18 μm and the transferred ink surface has a flat shape.

Then, the alumina substrate wherein the pattern of the gold-organic compound ink is formed through the UV curing photo polymer layer is burned in air at 650° C. for 20 minutes in an electric oven and the gold-organic compound ink is metallized to form a gold conductor pattern 61. The film thickness of the gold conductor pattern is 1.6 μm and the line width is 9 μm. In the case of the noble metallo-organic compound ink, the film thickness becomes about 1/10 to 1/20 of that of the pattern on printing according to the condition of burning.

There is no curable resin between the gold conductor pattern and the alumina substrate because almost all of it is burned and, further, the adhesion strength between the alumina substrate as the substrate and the gold conductor pattern is sufficiently strong and no peeling according to a scotch tape process is admitted.

The resistivity of gold after burning is $4.5 \times 10^{-6}$ Ω·cm and became slightly high in comparison with that of pure gold ($2.2 \times 10^{-6}$ Ω·cm because it contains impurity.

As the ink used for the circuit board, for example, an noble metallo-organic compound ink containing gold, silver, platinum, etc. or a metal paste wherein noble metal particles of gold, silver, etc. is dispersed in the resin such as epoxide resin, etc. is effective.

On the other hand, as the body to be printed, there can be used heat resistant films such as polyimide resin in addition to inorganic substrates such as glass, alumina, etc.

In the above processes, the intaglio printing plate can be made of glass or stainless steel in addition to that made of silicone wafer or silica substrate. However, according to the process of this embodiment, the groove shape of the intaglio printing plate is transferred as it is and, therefore, sufficient attention should be paid for making the intaglio printing plate.

In addition, as the releasing agent used for releasing treatment of the intaglio surface (particularly, the groove part), that having a surface tension of not more than 20 dyn/cm is effective. As the curable resin used for transferring, for example, there can be used heat-curable resins such as epoxy adhesive, etc. in addition to the photocurable resin cured by UV irradiation which is used in this embodiment.

What is claimed is:
1. An intaglio printing process comprising;
   (a) forming an intaglio printing plate having groove patterns,
   (b) filling said groove patterns with an ink,
   (c) after drying said ink, forming a curable resin layer on the whole surface of the intaglio printing plate,
   (d) placing a body to be printed thereon without curing said resin layer,
   (e) curing the curable resin, and
   (f) stripping the body from the intaglio printing plate to form the ink patterns corresponding to the groove patterns of the intaglio on the body.
2. The intaglio printing process according to claim 1, wherein a release layer is formed on the surface of the intaglio printing plate before filling with the ink.
3. The intaglio printing process according to claim 1, wherein the groove patterns of the intaglio printing plate are formed by reactive ion etching.
4. The intaglio printing process according to claim 1, wherein said curable resin is selected from the group consisting of heat-curable resin and photocurable resin.
5. The intaglio printing process according to claim 1, wherein the groove patterns of the intaglio printing plate are formed by ion milling.
6. The intaglio printing process according to claim 1, wherein said ink contains a member selected from the group consisting of an organic pigment and carbon as a main component.
7. The intaglio printing process according to claim 1 wherein said ink is obtained by mixing a member selected from the group consisting of a metal oxide and a metallo-organic compound as a main component, a member selected from the group consisting of an organic compound of a glass frit and an organic compound of a glass component as a sub component and an organic component to form a black matrix pattern.
8. The intaglio printing process according to claim 7 wherein said member selected from the group consisting of a metal oxide and a metallic-organic compound contains a metal of group IB, VB, VIB, VIIB or VIII of the periodic table as a component and the member selected from the group consisting of an organic compound of a glass frit and an organic compound of a glass component contains an element of group IIIA, IVA, VA or VIA of the periodic table.
9. The intaglio printing process according to claim 7 wherein said ink is a noble metal paste.
10. The intaglio printing process according to claim 9 further comprising (g) burning the stripped body.

* * * * *